US010711368B2

(12) United States Patent
Kim

(10) Patent No.: US 10,711,368 B2
(45) Date of Patent: Jul. 14, 2020

(54) METHOD FOR PRODUCING SILICON SINGLE CRYSTAL

(71) Applicant: SUMCO CORPORATION, Tokyo (JP)

(72) Inventor: Tegi Kim, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 119 days.

(21) Appl. No.: 15/778,256

(22) PCT Filed: Oct. 5, 2016

(86) PCT No.: PCT/JP2016/079664
§ 371 (c)(1),
(2) Date: May 23, 2018

(87) PCT Pub. No.: WO2017/090325
PCT Pub. Date: Jun. 1, 2017

(65) Prior Publication Data
US 2018/0355508 A1     Dec. 13, 2018

(30) Foreign Application Priority Data

Nov. 26, 2015 (JP) ................................. 2015-231072

(51) Int. Cl.
C30B 15/14     (2006.01)
C30B 29/06     (2006.01)
C30B 15/20     (2006.01)

(52) U.S. Cl.
CPC .............. *C30B 15/14* (2013.01); *C30B 15/20* (2013.01); *C30B 29/06* (2013.01)

(58) Field of Classification Search
CPC ...... B61D 17/02; B61D 27/0018; Y02T 30/32
See application file for complete search history.

(56) References Cited

U.S. PATENT DOCUMENTS

2008/0081767 A1\* 4/2008 Toutsuka ................ C30B 29/16
505/238

FOREIGN PATENT DOCUMENTS

| JP | 04-198087 | 7/1992 |
| JP | 06-305878 | 11/1994 |
| JP | 07-133185 | 5/1995 |
| JP | 11-255577 | 9/1999 |

(Continued)

OTHER PUBLICATIONS

Official Communication issued in Japan Patent Application No. PCT/JP2016/079664, dated Nov. 8, 2016.

(Continued)

*Primary Examiner* — Hua Qi
(74) *Attorney, Agent, or Firm* — Greenblum & Bernstein, P.L.C.

(57) ABSTRACT

A manufacturing method of monocrystalline silicon includes: melting silicon housed in a quartz crucible into a silicon melt by heating the quartz crucible with a heating unit; dipping a seed crystal into the silicon melt in the quartz crucible to bring the seed crystal into contact with the silicon melt; and pulling up the seed crystal to grow monocrystalline silicon. In the pulling-up, a formation of a straight body of the monocrystalline silicon is started at a power consumption of the heating unit being equal to or more than 10000 kWh to grow an entirety of the monocrystalline silicon.

4 Claims, 5 Drawing Sheets

(56) References Cited

FOREIGN PATENT DOCUMENTS

| | | |
|---|---|---|
| JP | 2002-226293 | 8/2002 |
| JP | 2006-69874 | 3/2006 |
| JP | 2006069874 A1 * | 3/2006 |
| JP | 3979291 B2 | 9/2007 |
| JP | 2012-82121 | 4/2012 |
| JP | 2012-91942 | 5/2012 |
| JP | 2015-151283 | 8/2015 |
| WO | 02/27076 | 4/2002 |

OTHER PUBLICATIONS

Office Action issued in Japan Counterpart Patent Appl. No. 2015-231072, dated Mar. 19, 2019, along with an English translation thereof.
Notice of Allowance in Korean Patent Application No. 10-2018-7014309, dated Nov. 28, 2019; and partial English-language translation thereof.

* cited by examiner

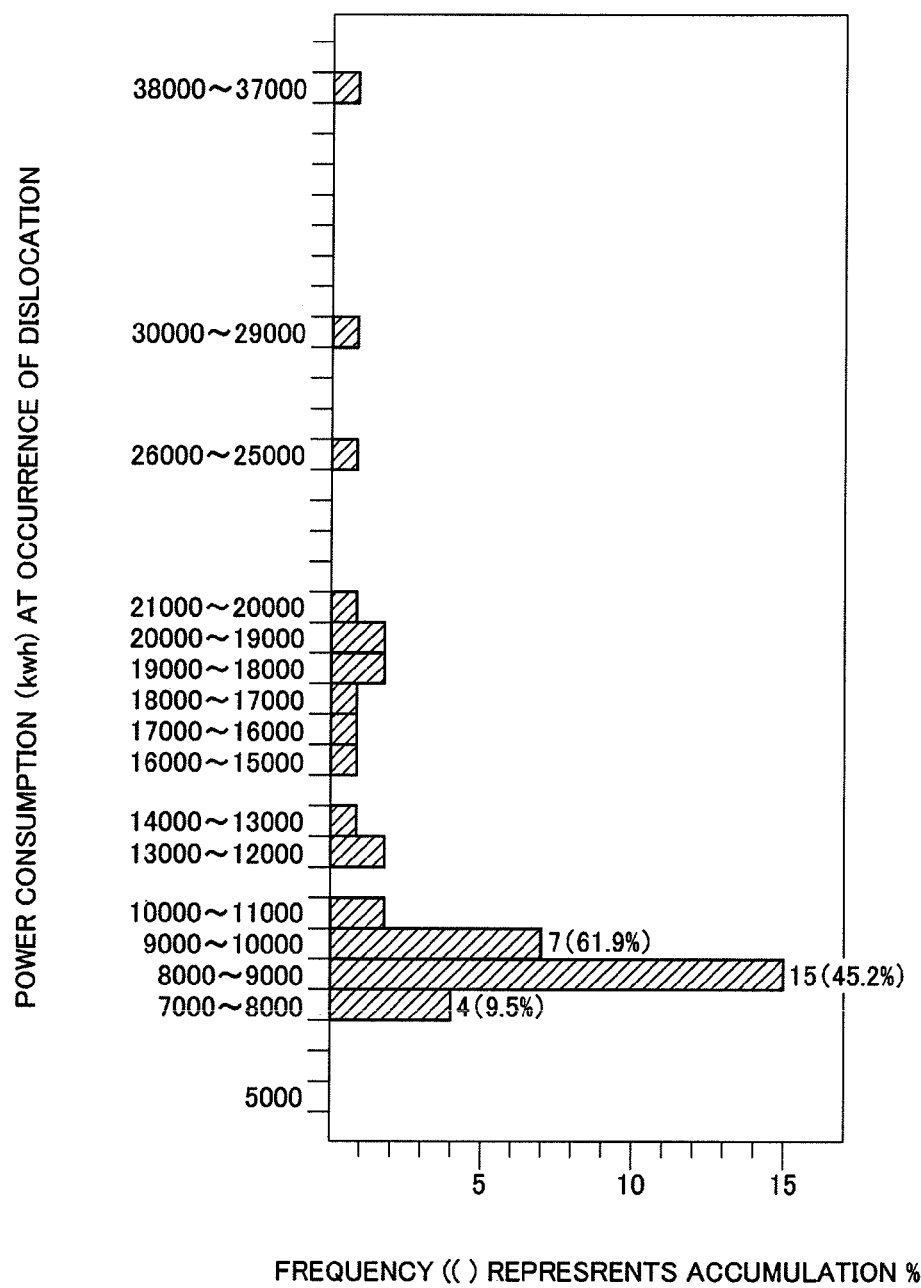

METHOD FOR PRODUCING SILICON SINGLE CRYSTAL

TECHNICAL FIELD

The present invention relates to a manufacturing method of monocrystalline silicon.

BACKGROUND ART

As a manufacturing method of monocrystalline silicon, an MCZ (Magnetic field applied Czochralski) method and a CZ (Czochralski) method requiring no magnetic field application are typically known. In the MCZ method and the CZ method, dislocation may occur in a straight body of the monocrystalline silicon. Accordingly, a solution for avoiding occurrence of dislocation has been studied (see, for instance, Patent Literatures 1 and 2).

In an apparatus of Patent Literature 1 relating the CZ method, a heat radiation body is raised or lowered relative to a heat shield to be positioned at an upper end of a quartz crucible, thereby inhibiting heat radiation from a silicon melt and efficiently transmitting heat of the heat radiation body to the silicon melt via the quartz crucible, so that the silicon melt can be heated to a predetermined temperature using a less electrical power. Moreover, a temperature of an inside, expanding to a lateral upper end, of the quartz crucible can be made uniform, so that the silicon melt can be prevented from adhering on an inner circumferential surface of the upper end of the quartz crucible to inhibit occurrence of dislocation.

In a method of Patent Literature 2 relating to the MCZ method, a step in which the silicon melt is left still while a magnetic field is applied to the silicon melt, and subsequently a step in which the application of the magnetic field is stopped and the silicon melt is left still are conducted after a melting step of melting a polycrystalline silicon and before a pull-up step of growing monocrystalline silicon. By this process, cristobalite is formed on a surface of the quartz crucible in the step in which the silicon melt is left still while a magnetic field is applied to the silicon melt, and subsequently cristobalite is appropriately melted in the step in which the application of the magnetic field is stopped, so that occurrence of dislocation is inhibitable.

CITATION LIST

Patent Literature(s)

Patent Literature 1 JP11-255577A
Patent Literature 2 JP2012-82121A

SUMMARY OF THE INVENTION

Problem(s) to be Solved by the Invention

The single-crystal pull-up apparatus of Patent Literature 1 adversely requires design alternation allowing the heat radiation body to be provided therein.

Moreover, the method of Patent Literature 2 is not applicable to the CZ method.

An object of the invention is to provide a simple and general-purpose manufacturing method of monocrystalline silicon in which occurrence of dislocation is reducible.

Means for Solving the Problem(s)

After dedicated studies, the inventors found that occurrence of dislocation in a straight body is reducible by starting forming a straight body of monocrystalline silicon after a power consumption of a heater configured to heat a quartz crucible becomes equal to or more than a predetermine value (i.e., $3.6 \times 10^{17}$ kJ of an energy amount given to the quartz crucible), and has achieved the invention.

According to an aspect of the invention, a manufacturing method of monocrystalline silicon includes: melting silicon housed in a quartz crucible into a silicon melt by heating the quartz crucible with a heating unit; dipping a seed crystal into the silicon melt in the quartz crucible to bring the seed crystal into contact with the silicon melt; and pulling up the seed crystal to grow the monocrystalline silicon, in which, in the pulling-up, a formation of a straight body of the monocrystalline silicon is started at a power consumption of the heater being equal to or more than 10000 kWh to grow an entirety of the monocrystalline silicon.

In the above aspect, preferably, the manufacturing method of monocrystalline silicon further includes: temporarily-growing and melting-back to be conducted between the dipping and the pulling-up, in which in the temporarily-growing, the seed crystal in contact with the silicon melt is pulled up to grow a part of the monocrystalline silicon, and, in the melting-back, the monocrystalline silicon grown in the temporarily-growing is melted in the silicon melt.

BRIEF DESCRIPTION OF DRAWING(S)

FIG. 1 schematically illustrates a structure of a single crystal pull-up apparatus according to an exemplary embodiment of the invention.

FIG. 5 shows a frequency distribution of a power consumption at the time of occurrence of dislocation in the above Comparative.

DESCRIPTION OF EMBODIMENT(S)

Exemplary Embodiment(s)

Figure 1:
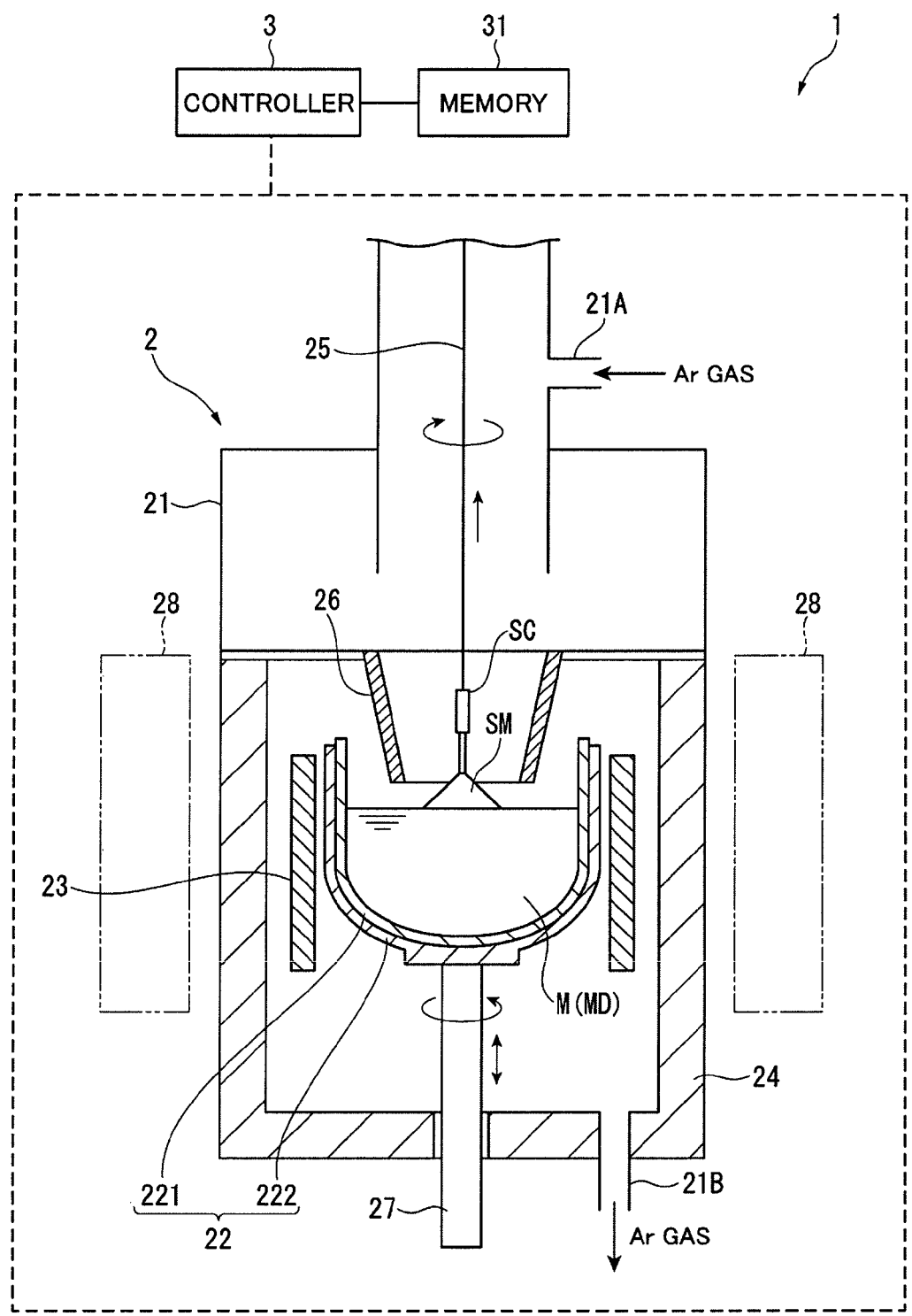

An exemplary embodiment of the invention will be described below with reference to the attached drawings.
Arrangement of Single-Crystal Pull-Up Apparatus A single-crystal pull-up apparatus 1, which is an apparatus used in the CZ method, includes a pull-up apparatus body 2 and a controller 3 as shown in FIG. 1.

The pull-up apparatus body 2 includes: a chamber 21; a crucible 22 disposed at the center of the chamber 21; a heater 23 (heating unit) configured to radiate heat to the crucible 22 to heat the crucible 22; a heat insulating cylinder 24; a pull-up cable 25; and a heat shield 26.

A gas inlet 21A through which an inert gas (e.g., Ar gas) is introduced into the chamber 21 is provided at an upper portion of the chamber 21. A gas outlet 21B through which the gas inside the chamber 21 is discharged by driving a vacuum pump (not shown) is provided at the bottom of the chamber 21.

The controller 3 controls the inert gas to be introduced at a predetermined gas flow rate into the chamber 21 through the gas inlet 21A provided at the upper portion of the chamber 21. The introduced gas is discharged from the gas outlet 21B provided at the bottom of the chamber 21, so that the inert gas flows downward from an upper side in the chamber 21.

A pressure within the chamber 21 (furnace pressure) is controllable by the controller 3.

The crucible 22 is configured to melt polycrystalline silicon as a raw material of a silicon wafer to provide a silicon melt M. The crucible 22 is supported by a support shaft 27 rotatable at a predetermined speed and vertically movable at a predetermined speed. The crucible 22 includes: a bottomed cylindrical quartz crucible 221; and a graphite crucible 222 housing the quartz crucible 221. It should be noted that the quartz crucible 221 and the graphite crucible 222 may have the following specification.

Quartz Crucible
Outer Diameter: 32 inch
Material: natural quartz or synthetic quartz
Thickness: from 13 mm to 35 mm
Graphite Crucible
Inner Diameter: 32 inch (a dimension enough for housing the quartz crucible)
Material: isotropic graphite or carbon-carbon composite material (C/C composite)

The heater 23 is disposed outside the crucible 22. The heater 23 heats the crucible 22 to melt the silicon in the crucible 22.

The heat insulating cylinder 24 is disposed to surround the crucible 22 and the heater 23.

A first end of the pull-up cable 25 is connected to a pull-up drive unit (not shown) disposed above the crucible 22. A second end of the pull-up cable 25 is attached to a seed crystal SC. The controller 3 controls the pull-up drive unit to move up and down the pull-up cable 25 at a predetermined speed and rotate the pull-up cable 25 around its own axis.

The heat shield 26 shields radiation heat upwardly radiated from the heater 23.

Based on the control program stored in the memory 31 and a setting inputted by an operator, the controller 3 controls a gas flow rate and a furnace internal pressure in the chamber 21, a heating temperature of an inside of the chamber 21 heated by the heater 23, a rotation speed of each of the crucible 22 and monocrystalline silicon SM, a timing of moving up and down the seed crystal SC, and the like to manufacture the monocrystalline silicon SM.

Manufacturing Method of Monocrystalline Silicon

Next, a manufacturing method of the monocrystalline silicon SM will be described below.

Figure 2:
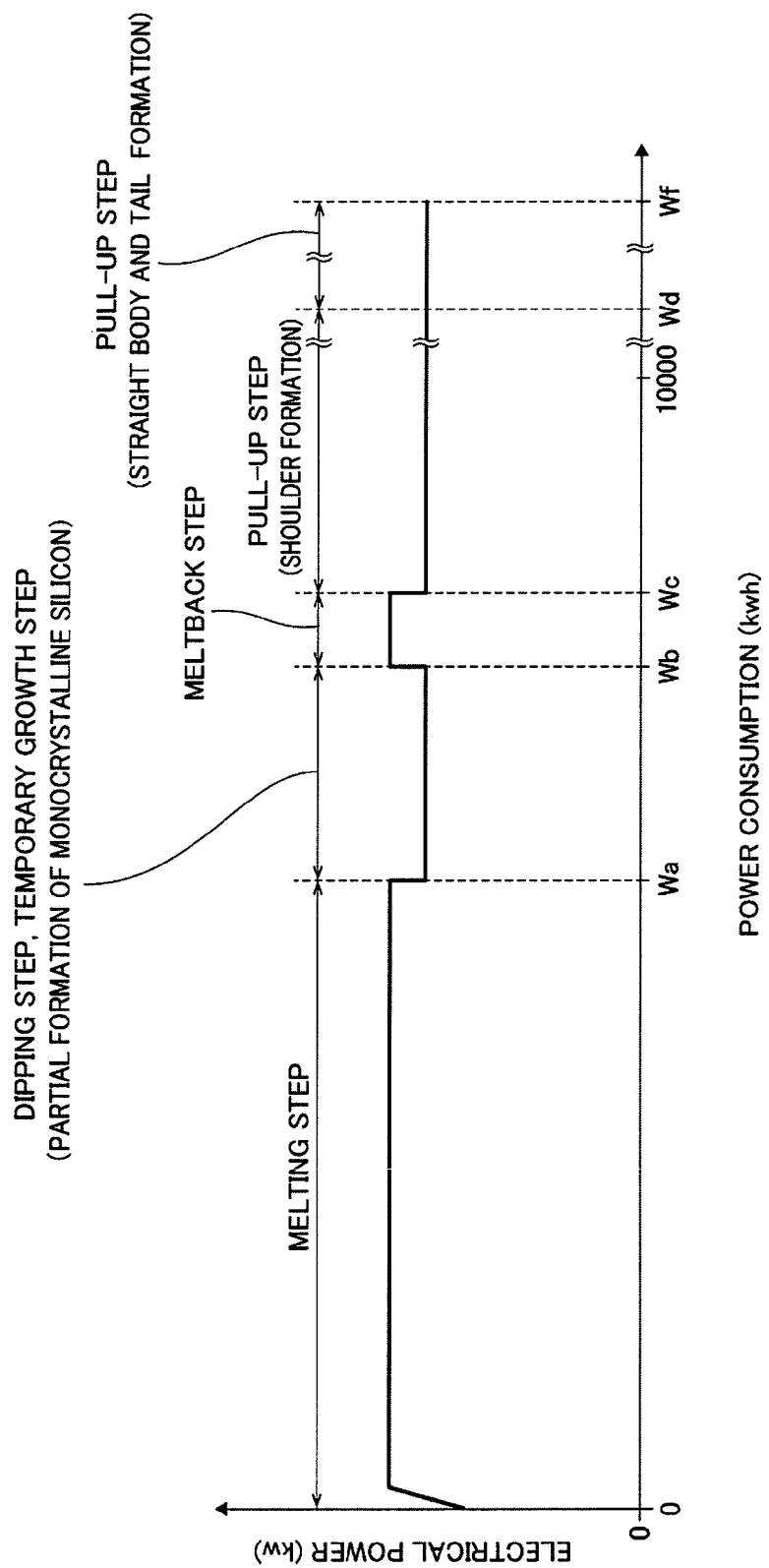
FIG. 2 is an illustration for explaining a manufacturing method of monocrystalline silicon in the above exemplary embodiment and Example 1 of the invention.

FIG. 2 is an illustration for explaining the manufacturing method of the monocrystalline silicon SM in the exemplary embodiment, in which the ordinate axis represents an electrical power supply to the heater 23 and the abscissa axis represents a power consumption of the heater 23.

In the exemplary embodiment, the shoulder refers to a region formed continuous with the seed crystal SC and having a gradually increasing diameter, the straight body refers to a region formed continuous with the shoulder and having an approximately uniform diameter, and the tail refers to a region formed continuous with a lower end of the straight body and having a diameter gradually reduced to zero.

First, as shown in FIG. 2, the controller 3 of the single-crystal pull-up apparatus 1 starts supplying electrical power to the heater 23 whose power consumption is zero to heat the crucible 22, in which a polysilicon material and a dopant are received, until the power consumption reaches Wa (kWh) (Wa<10000), thereby melting the polysilicon material and the dopant to prepare a dopant-added melt MD (the melting). During the melting, the controller 3 introduces Ar gas at a predetermined flow rate from the gas inlet 21A into the chamber 21 while reducing the pressure inside the chamber 21, thereby maintaining the chamber 21 under an inert atmosphere at the reduced pressure.

After the power consumption reaches Wa, the controller 3 reduces the electrical power supply to the heater 23 and lowers the pull-up cable 25, thereby bringing the seed crystal SC into contact with the dopant-added melt MD (the dipping).

The controller 3 pulls up the pull-up cable 25 while rotating the crucible 22 and the pull-up cable 25 in respective directions, thereby growing a part of the monocrystalline silicon SM (the temporarily-growing). It should be noted that, in the temporarily-growing, a part or an entirety of the shoulder of the monocrystalline silicon SM may be grown, or a part or an entirety of the straight body in addition to the entirety of the shoulder may be grown.

Next, when the temporarily-growing ends and the power consumption reaches Wb (kWh) (Wb<10000), the controller 3 increases the electrical power supply to the heater 23 to be substantially the same as that in the melting and lowers the pull-up cable 25, thereby melting the monocrystalline silicon SM, which is grown in the temporarily-growing, in the dopant-added melt MD (the melting-back).

Subsequently, when the melting-back ends and the power consumption reaches Wc (kWh) (Wc<10000), the controller 3 decreases the electrical power supply to the heater 23 to be substantially the same as that in the temporarily-growing and then controls in the same manner as in the temporarily-growing, thereby growing an entirety of the monocrystalline silicon SM (the pulling-up).

In the pulling-up, a shoulder is formed until the power consumption reaches Wd (kWh) (10000<Wd<12000), and subsequently a straight body and a tail are formed until the power consumption reaches Wf (kWh) (10000<Wf). Specifically, in the pulling-up, the formation of the straight body of the monocrystalline silicon SM is started at the power consumption of the heater 23 ranging from 10000 kWh to 12000 kWh to grow the entirety of the monocrystalline silicon SM.

The monocrystalline silicon SM with a reduced occurrence of dislocation in the straight body is manufactured through the above process.

Advantage(s) of Exemplary Embodiment(s)

In the above exemplary embodiment, unlike the apparatus of Patent Literature 1, without providing the heat radiation body, occurrence of dislocation can be inhibited by simply starting forming the straight body when the power consumption of the heater 23 becomes equal to or more than 10000 kWh. Moreover, since the above manufacturing method is applicable also to an MCZ method as described later, a general-purpose method of manufacturing the monocrystalline silicon SM can be provided by applying the above manufacturing method.

Particularly, by starting the formation of the straight body at the power consumption of the heater 23 being equal to or less than 12000 kWh, a decrease in productivity of the monocrystalline silicon SM caused by prolonging a manufacturing time of the monocrystalline silicon SM can be inhibited.

Modifications

It should be understood that the scope of the invention is not limited to the above-described exemplary embodiment(s) but various improvements and design alterations are possible as long as such improvements and alterations are compatible with the invention. In addition, specific procedures for implementing the invention and the arrangements of the invention may be modified as long as an object of the invention is achievable.

Figure 3:
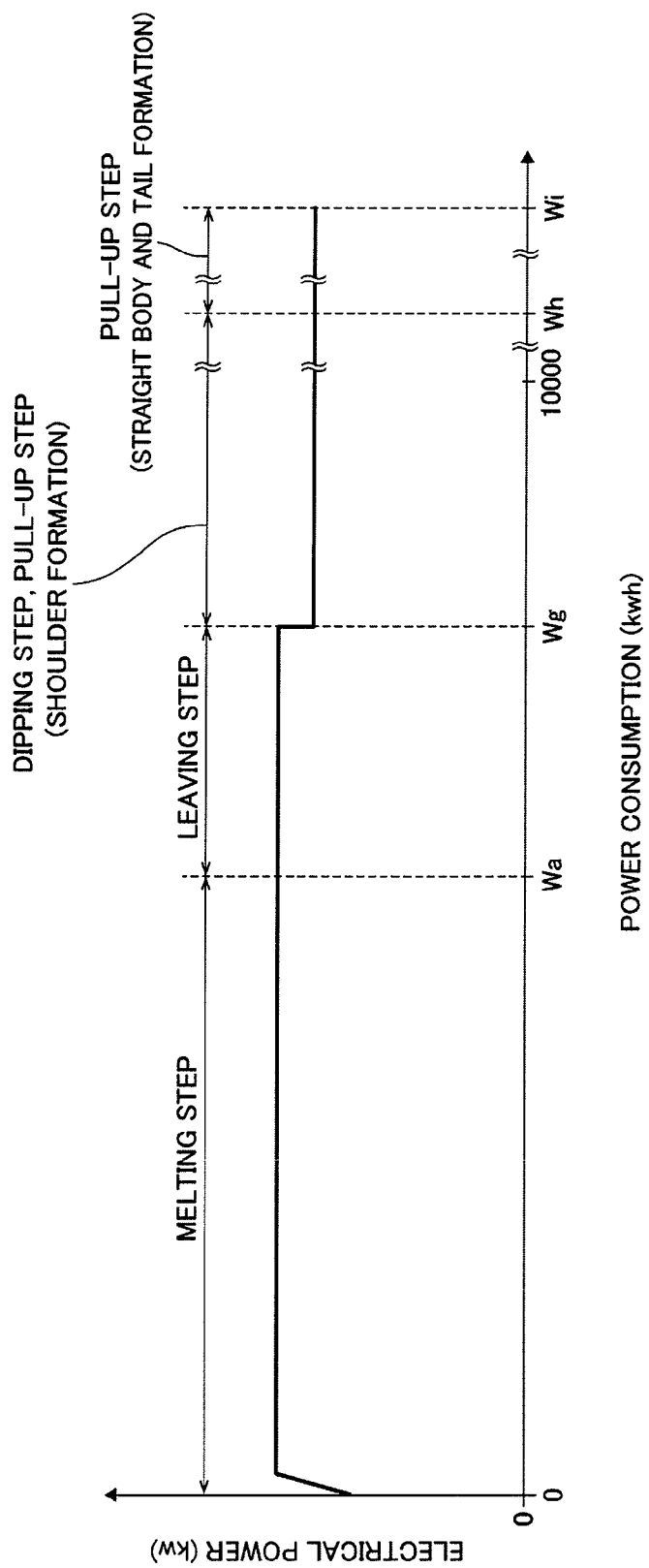
FIG. 3 is an illustration for explaining a manufacturing method of monocrystalline silicon in a modification and Example 2 of the invention.

For instance, a manufacturing method of the monocrystalline silicon SM as shown in FIG. 3 may be used.

In this manufacturing method, the controller 3 conducts the same melting as in the above exemplary embodiment until the power consumption of the heater 23 starting from zero reaches Wa, and subsequently the dopant-added melt MD is left still in a molten state until the power consumption reaches Wg (kWh) (Wg<10000) without changing the electrical power supply (the leaving).

Next, the controller 3 decreases the electrical power supply to the heater 23 and conducts the same dipping as in the above exemplary embodiment to grow an entirety of the monocrystalline silicon SM (the pulling-up) without conducting the temporarily-growing and the melting-back subsequent to the dipping.

In the pulling-up, the shoulder is formed until the power consumption reaches Wh (kWh) (10000<Wh<12000), and subsequently the straight body and the tail are formed until the power consumption reaches Wi (kWh) (10000<Wi).

Also in this manufacturing method, in the pulling-up, the formation of the straight body of the monocrystalline silicon SM is started at the power consumption of the heater 23 ranging from 10000 kWh to 12000 kWh to grow the entirety of the monocrystalline silicon SM, so that occurrence of dislocation in the straight body is reducible and reduction in the productivity of the monocrystalline silicon SM is inhibitable.

In the manufacturing method of the monocrystalline silicon as shown in FIG. 2, each of the temporarily-growing and the melting-back may be conducted twice or more times.

In the manufacturing method of the monocrystalline silicon as shown in FIG. 3, the leaving may be conducted until the power consumption becomes equal to or more than 10000 kWh.

In the manufacturing method of the monocrystalline silicon as shown in FIG. 3, each of the temporarily-growing and the melting-back may be conducted once or more times after the dipping.

In the manufacturing method of the monocrystalline silicon as shown in FIG. 3, a meltback simulation may be conducted in place of the leaving. The meltback simulation means leaving the seed crystal SC in no contact with the dopant-added melt MD while the electrical power supply to the heater 23 is controlled as shown in a period from Wa (kWh) to We (kWh) of the power consumption in FIG. 2.

In the manufacturing method of the monocrystalline silicon as shown in FIGS. 2 and 3, the formation of the straight body of the monocrystalline silicon SM may start after the power consumption of the heater 23 exceeds 12000 kWh.

A specification of each of the quartz crucible 221 and the graphite crucible 222 may be different from the above-described specification as long as an advantage of the invention is obtainable.

The manufacturing method of the monocrystalline silicon of the invention may be applied to an MCZ method of applying a magnetic field to a melt. In this case, it is only required that a pair of electromagnetic coils 28 are provided facing each other outside the chamber 21 with the crucible 22 interposed therebetween and as shown in chain double-dashed lines in FIG. 1 to inhibit natural convection of the silicon melt M using a traverse magnetic field in the horizontal direction.

EXAMPLE(S)

Next, the invention will be described below in more detail with reference to Example(s). It should be noted, however, the scope of the invention is by no means limited by the Example(s).

According to the manufacturing method of monocrystalline silicon in each of Comparative and Examples 1 and 2 shown below, monocrystalline silicon was manufactured and a relationship between the power consumption of the heater 23 at the starting time of the formation of the straight body and occurrence of dislocation in the straight body was examined. In each of Comparative and Examples 1 and 2, a p+ monocrystalline silicon having a 300-mm diameter and a straight body whose an oxygen concentration was $13.0 \times 10^{17}$ atoms/cm$^3$ or more was manufactured using the single-crystal pull-up apparatus 1 shown in FIG. 1.

First, a manufacturing method of the monocrystalline silicon in Comparative will be described below.

Figure 4:
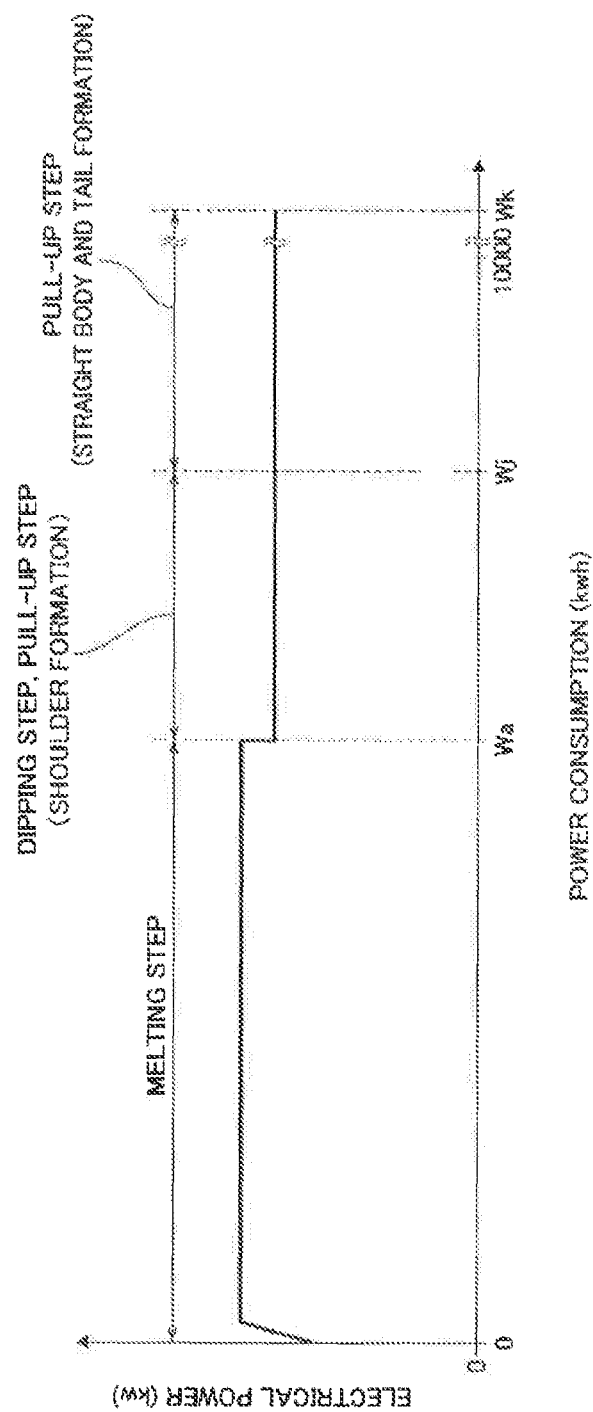
FIG. 4 is an illustration for explaining a manufacturing method of monocrystalline silicon in Comparative of the invention.

In the manufacturing method of Comparative as shown in FIG. 4, the same melting as in the above exemplary embodiment was conducted until the power consumption of the heater 23 starting from zero reached Wa. Immediately after the melting, the electrical power supply to the heater 23 was decreased and the same dipping as in the exemplary embodiment was conducted to grow an entirety of the monocrystalline silicon (the pulling-up) without conducting the temporarily-growing and the melting-back subsequent to the dipping.

In the pulling-up, the shoulder was formed until the power consumption reached Wj (kWh) (Wj<10000), and subsequently the straight body and the tail were formed until the power consumption reached Wk (kWh) (10000<Wk).

In other words, in Comparative, the formation of the straight body starts at the power consumption of the heater 23 being less than 10000 kWh.

A plurality of monocrystalline silicon were manufactured according to the manufacturing method of Comparative while observing whether dislocation occurred in the straight body. Table 1 shows conditions of occurrence of dislocation. FIG. 5 shows a frequency distribution of the power consumption of the heater 23 at the time of occurrence of dislocation.

It should be noted that an "ALL DF ratio" in Table 1 represents a ratio of monocrystalline silicon pieces in which no occurrence of dislocation was observed in the straight body relative to all of the plurality of monocrystalline silicon pieces.

$$AD (\%) = B1/B2 \times 100 \quad (1)$$

AD: ALL DF ratio

B1: the total number of the monocrystalline silicon in which no occurrence of dislocation was observed on the straight body B2: the total number of the manufactured monocrystalline silicon

TABLE 1

|  | ALL DF Ratio | Sample Number |
|---|---|---|
| Comparative | 0% | 42 |
| Example 1 | 70% | 10 |
| Example 2 | 100% | 1 |

As shown in Table 1, in Comparative, since the ALL DF ratio was 0%, occurrence of dislocation was observed in the straight bodies of all the manufactured monocrystalline silicon pieces.

Moreover, as shown in FIG. 5, it was observed that occurrence of dislocation in the straight bodies was concentrated at the power consumption ranging from 7000 kWh to less than 10000 kWh.

The inventors inferred below why occurrence of dislocation was concentrated at the above range.

A manufacturing method of monocrystalline silicon having a high oxygen concentration is exemplified by a method of promoting incorporation of oxygen from the quartz crucible 221 into the silicon melt (dopant-added melt). In this method of promoting the incorporation, a reaction on an inner surface of the quartz crucible 221 is promoted, where the state of the inner surface changes from an amorphous state to a brown ring and recrystallization. Since a plurality of crystalline forms are present in the inner surface of the quartz crucible 221, a difference in thermal expansion between the crystalline forms during the change in the state of the inner surface causes a quartz piece to peel off from the inner surface. When the quartz piece is incorporated into the monocrystalline silicon, it is considered that a stress is locally generated, whereby dislocation easily occurs.

On the other hand, the reaction of the quartz crucible 221 is correlated with an oxygen concentration, a heating temperature and a heating time of the quartz crucible 221. The heating temperature and the heating time of the quartz crucible 221 are correlated with the power consumption of the heater 23 (heating unit).

From the foregoing, the inventors inferred that the quartz piece easily peeled off by the reaction of the quartz crucible 221 at the power consumption of the heater 23 ranging from 7000 kWh to less than 10000 kWh and the incorporation of the quartz piece into the straight body caused occurrence of dislocation to concentrate on the straight body.

Here, the inventors made an assumption that, if the formation of the straight body was started after the power consumption of the heater 23 became equal to or more than 10000 kWh, the quartz piece would peel off before the formation of the straight body and be inhibited from peeling off after the formation of the straight body starts, so that a probability of the quartz piece to be incorporated into the straight body would become low to reduce occurrence of dislocation. In order to verify this assumption, Examples 1 and 2 below were conducted.

According to the manufacturing method of the exemplary embodiment shown in FIG. 2 in Example 1 and according to the manufacturing method of the modification shown in FIG. 3 in Example 2, the respective monocrystalline silicon were manufactured while observing in the same manner as in Comparative whether dislocation occurred in the straight body.

As shown in Table 1, Examples 1 and 2 exhibited the respective ALL DF ratios of 70% and 100%. Accordingly, it was confirmed that occurrence of dislocation in each of Examples 1 and 2 was more reducible than that in Comparative. In Example 1, dislocation occurred at the power consumption of about 17000 kWh, about 19000 kWh, and about 20000 kWh.

From the foregoing, it was confirmed that the above assumption was correct, specifically, that occurrence of dislocation in the straight body was reducible by starting the formation of the straight body after the power consumption of the heater 23 became equal to or more than 10000 kWh.

The invention claimed is:

1. A manufacturing method of monocrystalline silicon, comprising:
   melting silicon housed in a quartz crucible into a silicon melt by heating the quartz crucible with a heating unit;
   dipping a seed crystal into the silicon melt in the quartz crucible to bring the seed crystal into contact with the silicon melt; and
   pulling up the seed crystal to grow the monocrystalline silicon, wherein
   in the pulling-up, a formation of a straight body of the monocrystalline silicon is started at a power consumption of the heating unit being equal to or more than 10000 kWh to grow an entirety of the monocrystalline silicon.

2. The manufacturing method of the monocrystalline silicon according to claim 1, further comprising:
   temporarily-growing and melting-back to be conducted between the dipping and the pulling-up, wherein
   in the temporarily-growing, the seed crystal in contact with the silicon melt is pulled up to grow a part of the monocrystalline silicon, and
   in the melting-back, the monocrystalline silicon grown in the temporarily-growing is melted in the silicon melt.

3. The method of claim 1, further comprising:
   between the melting and the dipping, leaving the silicon melt still in a molten state without changing an electrical power supply to the heating unit.

4. The method of claim 1, wherein the power consumption of the heating unit is equal to 37000 KWh or less.

* * * * *